(12) United States Patent
Mazure et al.

(10) Patent No.: US 8,987,114 B2
(45) Date of Patent: Mar. 24, 2015

(54) BONDED SEMICONDUCTOR STRUCTURES AND METHOD OF FORMING SAME

(75) Inventors: Carlos Mazure, Bernin (FR); Bich-Yen Nguyen, Austin, TX (US); Mariam Sadaka, Austin, TX (US)

(73) Assignee: SOITEC, Bernin (FR)

( * ) Notice: Subject to any disclaimer, the term of this patent is extended or adjusted under 35 U.S.C. 154(b) by 116 days.

(21) Appl. No.: 13/637,565

(22) PCT Filed: Feb. 22, 2011

(86) PCT No.: PCT/US2011/025647
§ 371 (c)(1),
(2), (4) Date: Sep. 26, 2012

(87) PCT Pub. No.: WO2011/123199
PCT Pub. Date: Oct. 6, 2011

(65) Prior Publication Data
US 2013/0015442 A1   Jan. 17, 2013

Related U.S. Application Data

(60) Provisional application No. 61/319,495, filed on Mar. 31, 2010.

(51) Int. Cl.
*H01L 21/00* (2006.01)
*H01L 27/06* (2006.01)
(Continued)

(52) U.S. Cl.
CPC .......... *H01L 27/0688* (2013.01); *H01L 21/187* (2013.01); *H01L 21/8221* (2013.01); *H01L 21/02532* (2013.01); *H01L 21/0262* (2013.01); *H01L 21/02667* (2013.01)
USPC ........................................................ 438/455

(58) Field of Classification Search
None
See application file for complete search history.

(56) References Cited

U.S. PATENT DOCUMENTS

| 6,093,623 A | 7/2000 | Forbes |
| 6,303,468 B1 | 10/2001 | Aspar |

(Continued)

FOREIGN PATENT DOCUMENTS

WO    2008148882 A2    12/2008

OTHER PUBLICATIONS

Christiansen et al., Wafer Direct Bonding: From Advanced Substrate Engineering to Future Applications in Micro/Nanoelectronics, Proceedings of the IEEE, vol. 94, No. 12, pp. 2060-2106 (2006).

(Continued)

*Primary Examiner* — Charles Garber
*Assistant Examiner* — Evren Seven
(74) *Attorney, Agent, or Firm* — TraskBritt

(57) ABSTRACT

Methods of forming semiconductor structures include transferring a portion (116a) of a donor structure to a processed semiconductor structure (102) that includes at least one non-planar surface. An amorphous film (144) may be formed over at least one non-planar surface of the bonded semiconductor structure, and the amorphous film may be planarized to form one or more planarized surfaces. Semiconductor structures include a bonded semiconductor structure having at least one non-planar surface, and an amorphous film disposed over the at least one non-planar surface. The bonded semiconductor structure may include a processed semiconductor structure and a portion of a single crystal donor structure attached to a non-planar surface of the processed semiconductor structure.

15 Claims, 4 Drawing Sheets

(51) Int. Cl.
*H01L 21/18* (2006.01)
*H01L 21/822* (2006.01)
*H01L 21/02* (2006.01)

(56) References Cited

U.S. PATENT DOCUMENTS

| | | | |
|---|---|---|---|
| 6,335,258 | B1 | 1/2002 | Aspar et al. |
| 6,472,244 | B1 * | 10/2002 | Ferrari et al. ............. 438/53 |
| 6,756,286 | B1 | 6/2004 | Moriceau et al. |
| 6,809,044 | B1 | 10/2004 | Aspar et al. |
| 6,946,365 | B2 * | 9/2005 | Aspar et al. ............. 438/457 |
| RE39,484 | E | 2/2007 | Bruel |
| 7,955,937 | B2 * | 6/2011 | Wieczorek et al. ......... 438/311 |
| 2003/0114001 | A1 | 6/2003 | Jones et al. |
| 2007/0013001 | A1 | 1/2007 | Furukawa et al. |
| 2012/0083098 | A1 * | 4/2012 | Berger et al. ............. 438/458 |
| 2014/0070232 | A1 * | 3/2014 | Berger et al. ............. 257/77 |

OTHER PUBLICATIONS

International Search Report for International Application No. PCT/US2011/025647 mailed May 10, 2011, 5 pages.
International Written Opinion for International Application No. PCT/US2011/025647 mailed May 10, 2011, 7 pages.
Tong et al., Semiconductor wafer bonding: recent developments, Materials, Chemistry and Physics, vol. 37, pp. 101-127 (1994).
Yun et al., Fabrication of Silicon and Oxide Membranes Over Cavities Using Ion-Cut Layer Transfer, Journal of Microelectromechanical Systems, vol. 9, No. 4, Dec. 2000, pp. 474-477.
International Preliminary Report on Patentability for International Application No. PCT/US2011/025647 dated Oct. 2, 2012, 6 pages.

* cited by examiner

BONDED SEMICONDUCTOR STRUCTURES AND METHOD OF FORMING SAME

CROSS-REFERENCE TO RELATED APPLICATIONS

This is a national phase entry under 35 U.S.C. §371 of International Patent Application PCT/U.S.2011/025647 filed Feb. 22, 2011, which application claims the benefit of the filing date of U.S. Provisional Patent Application Ser. No. 61/319,495, filed Mar. 31, 2010, for "BONDED SEMICONDUCTOR STRUCTURES AND METHOD OF FORMING SAME," the disclosure of each of which is hereby incorporated herein by this reference in its entirety.

TECHNICAL FIELD

Embodiments of the present invention generally relate to methods for forming semiconductor structures and to the resulting structures formed using such methods and, more particularly, to bonded semiconductor structures and methods of forming the same.

BACKGROUND

The three-dimensional (3D) integration of two or more semiconductor structures can produce a number of benefits to microelectronic applications. For example, 3D integration of microelectronic components can result in improved electrical performance and power consumption while reducing the area of the device footprint. See, for example, P. Garrou, et al. "The Handbook of 3D Integration," Wiley-VCH (2008).

The 3D integration of semiconductor structures may be achieved by a number of methods, including, for example, the transfer of one or more semiconductor layers to a processed semiconductor structure, which may include a plurality of device structures. The transfer of a semiconductor layer to a processed semiconductor structure may be achieved by transferring a portion of a donor structure to the processed semiconductor structure using, for example, methods such as, ion implantation, bonding, and separation. The transferred portion of the donor structure may undergo further processes, for example, to produce additional device structures therein, which may be integrated with underlying device structures. However, the processes involved in forming the processed semiconductor structure and in the transfer of a portion of the donor structure to the processed semiconductor structure may detrimentally affect the quality of the bonded semiconductor structure.

It should be noted that the 3D integration of semiconductor structures may take place by the attachment of a semiconductor die to one or more additional semiconductor dies (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

BRIEF SUMMARY

Embodiments of the present invention may provide methods and structures for forming semiconductor structures, and more particularly, methods and structures for forming bonded semiconductor structures. This summary is provided to introduce a selection of concepts in a simplified form that are further described in the detailed description of embodiments of the invention. This summary is not intended to identify key features or essential features of the claimed subject matter, nor is it intended to be used to limit the scope of the claimed subject matter.

Therefore, in some embodiments of the present invention, methods of forming a semiconductor structure may include transferring a portion of a donor structure to a processed semiconductor structure and forming a bonded semiconductor structure comprising one or more non-planar surfaces. An amorphous film may be formed over at least the one or more non-planar surfaces of the bonded semiconductor structure, and the amorphous film may be planarized to form one or more planarized surfaces. Planarizing the amorphous film may comprise removing a portion of the amorphous film outside at least one recess in the one or more non-planar surfaces, and leaving a portion of the amorphous film within the at least one recess in the one or more non-planar surfaces.

In additional embodiments of the invention, methods of forming a semiconductor structure may include forming a plurality of device structures on or in a semiconductor structure to produce a processed semiconductor structure comprising a non-planar major surface and a non-planar lateral side surface. A portion of a donor structure at least substantially comprised by a single crystal of semiconductor material may be transferred to the non-planar major surface of the processed semiconductor structure to form a bonded semiconductor structure having a non-planar major surface and a non-planar lateral side surface. An amorphous film may be formed over the non-planar lateral side surface and the non-planar major surface of the bonded semiconductor structure, and at least the non-planar major surface of the bonded semiconductor structure may be planarized by selectively removing portions of the amorphous film.

Embodiments of the invention may also include semiconductor structures formed by methods described herein. In some embodiments of the invention, a semiconductor structure includes a bonded semiconductor structure having a non-planar major surface and a non-planar lateral side surface, and an amorphous film disposed over the non-planar lateral side surface and the non-planar major surface of the bonded semiconductor structure. The bonded semiconductor structure may include a processed semiconductor structure comprising a non-planar major surface and a non-planar lateral side surface, and a portion of a single crystal donor structure attached to the non-planar major surface of the processed semiconductor structure.

In some embodiments of the invention, a semiconductor structure comprises a bonded semiconductor structure having a non-planar major surface and a non-planar lateral side surface, and a plurality of regions of recrystallized crystalline material disposed over valley regions of the non-planar lateral side surface and the non-planar major surface of the bonded semiconductor structure. The bonded semiconductor structure may include a processed semiconductor structure comprising a plurality of device structures, a non-planar major surface, and a non-planar lateral side surface. The bonded semiconductor structure may also include a portion of a single crystal donor structure attached to the non-planar major surface of the processed semiconductor structure. Further aspects, details, and alternate combinations of elements of additional embodiments of this invention will be apparent from the following detailed description.

BRIEF DESCRIPTION OF THE DRAWINGS

Embodiments of the present invention may be understood more fully by reference to the following detailed description of embodiments of the present invention, illustrative examples of specific embodiments of the invention, and the appended figures in which.

DETAILED DESCRIPTION OF THE INVENTION

Figure 1A:
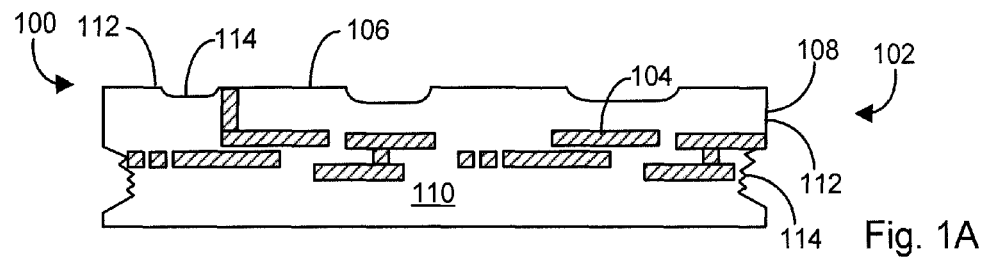
FIGS. 1A-1G schematically illustrate example embodiments of the invention for forming bonded semiconductor structures.

The illustrations presented herein are not meant to be actual views of any particular material, apparatus, system, or method, but are merely idealized representations that are employed to describe embodiments of the present invention.

Headings are used herein for clarity only and without any intended limitation. A number of references are cited herein. None of the cited references, regardless of how characterized herein, is admitted as prior art relative to the invention of the subject matter claimed herein.

As used herein, the term "semiconductor structure" means and includes any structure comprising a semiconductor material and that is used in the formation of a semiconductor device. Semiconductor structures include, for example, bulk semiconductor material bodies such as semiconductor dies and wafers, as well as assemblies or composite structures that include a layer or region of semiconductor material and one or more other materials such as metals and/or insulators thereon. Semiconductor structures also include fully fabricated semiconductor devices, as well as intermediate structures formed during fabrication of semiconductor devices.

As used herein, the term "processed semiconductor structure" means and includes any semiconductor structure that includes one or more at least partially formed device structures.

As used herein, the term "device structure" means and includes any portion of a semiconductor structure that is, includes, or defines at least a portion of an active or passive component of a semiconductor device to be formed from the semiconductor structure. For example, device structures include active and passive components of integrated circuits such as, for example, transistors, transducers, capacitors, resistors, conductive lines, conductive vias, and conductive contact pads.

As used herein, the term "bonded semiconductor structure" means and includes any structure that includes two or more semiconductor structures that are attached together.

Embodiments of the invention comprise methods and structures for forming semiconductor structures and, more particularly, to semiconductor structures that include bonded semiconductor structures and methods of forming such semiconductor structures. The bonded semiconductor structures may include a processed semiconductor structure that includes a plurality of device structures and a transferred portion of a donor structure carried by (e.g., bonded to) the processed semiconductor structure. The bonded structure may also include one or more non-planar surfaces, and embodiments of the invention may include the planarization of the one or more non-planar surfaces and the formation of an additional number of device structures within the planarized surfaces. Such additional device structures may be electrically interconnected with the device structures of the processed semiconductor structure. Such methods and structures may be utilized for various purposes, such as, for example, for 3D integration processes and 3D integrated structures.

Example embodiments of the invention are described below with reference to FIGS. 1A-1G. FIG. 1A illustrates a processed semiconductor structure 100. Processed semiconductor structure 100 may include a number of device structures 104 and one or more non-planar surfaces such as, for example, a non-planar major surface 106 (e.g., a top surface) and a non-planar lateral side surface 108.

In greater detail, embodiments of the invention may proceed by forming a processed semiconductor structure 100 comprising one or more non-planar surfaces. The one or more non-planar surfaces may include a non-planar major surface 106 and a non-planar lateral side surface 108. Forming processed semiconductor structure 100 may comprise fabricating a number of device structures 104 in a semiconductor structure 110. The number of device structures 104 may comprise, for example, one or more of switching structures (e.g., transistors, etc.), light-emitting structures (e.g., laser diodes, light-emitting diodes, etc.), light-receiving, emitting, or guiding structures (e.g., waveguides, splitters, mixers, photodiodes, solar cells, solar subcells, etc.), and microelectromechanical system structures (e.g., accelerometers, pressure sensors, etc).

Methods for fabricating the number of device structures 104 may result in processed semiconductor structure 100 including a non-planar major surface 106 and a non-planar lateral side surface 108. The topology of the non-planar surfaces 106 and 108 may comprise a plurality of peak regions 112 and a plurality of valley regions 114. Methods for fabricating the number of device structures 104 may comprise, for example, one or more of lithography, etching, cleaning, ion implantation, bonding, deposition, handling and metallization.

The processed semiconductor structure 100 may comprise a number of layers and materials. Processed semiconductor structure 100 may comprise semiconductor materials, such as, for example, one or more of silicon, germanium, silicon carbide, III-arsenides, III-phosphides, III-nitrides, and III-antimonides. The processed semiconductor structure 100 may also include non-semiconductor materials utilized in conjunction with semiconductor materials for the fabrication of device structures. Non-semiconductor materials utilized in conjunction with semiconductor materials may include conducting materials (e.g., metallic materials), such as, for example, one or more of cobalt, ruthenium, nickel, tantalum, tantalum nitride, indium oxide, tungsten, tungsten nitride, titanium nitride, copper and aluminum. In addition, non-semiconductor materials utilized in conjunction with semiconductor materials may include insulating materials (e.g., dielectric materials), such as, for example, one or more of polyimides, benzocyclobutene (BCB), boron nitrides, boron carbide nitrides, porous silicates, silicon oxides, silicon nitrides, other oxides, other nitrides, and mixtures thereof.

Figure 1B:
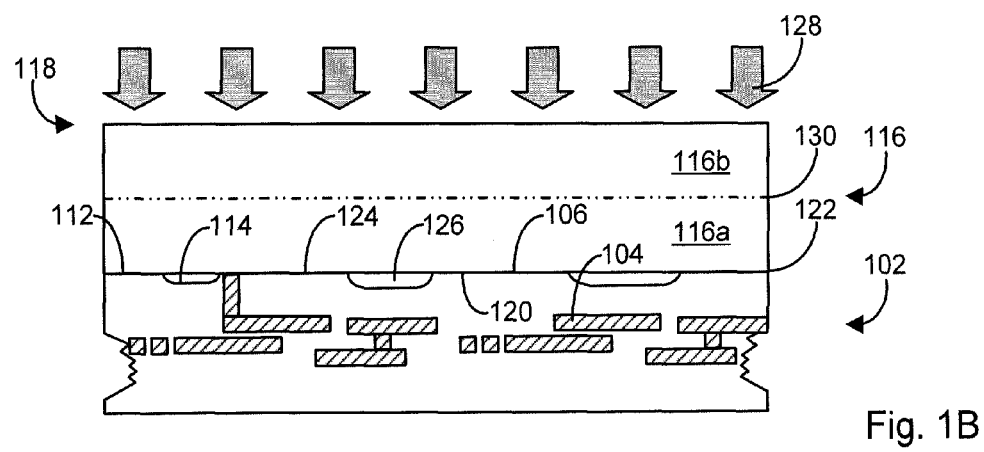

Referring to FIG. 1B, a portion of a donor structure 116 may be transferred to the non-planar major surface 106 of the processed semiconductor structure 100. A transferred portion of the donor structure 116 may be utilized for the fabrication of additional device structures, which may be electrically interconnected to device structures 104 of processed semiconductor structure 100, as discussed in further detail below.

FIG. 1B illustrates a bonded semiconductor structure 118, which comprises processed semiconductor structure 100 and donor structure 116. Donor structure 116 may comprise materials and structures as described for processed semiconductor structure 100. In some embodiments, donor structure 116 may comprise a single crystal of a semiconductor material, which may be selected from, for example, silicon, germanium, silicon carbide, III-arsenides, III-phosphides, III-nitrides, and III-antimonides.

To transfer a portion of donor structure 116 to the non-planar major surface 106 of processed semiconductor structure 100, a surface 120 of donor structure 116 may be attached to the non-planar major surface 106 of processed semiconductor structure 100.

Donor structure 116 may be attached to processed semiconductor structure 100 using, for example, a bonding process along a discontinuous bonding interface 122 between the non-planar major surface 106 of the processed semiconductor structure 100 and an adjacent surface 120 of the donor structure 116. For further information on the bonding of semiconductor structures, see, for example, the journal publications of Tong et al., Materials, Chemistry and Physics 37 101 1994, entitled "Semiconductor wafer bonding: recent developments," and Christiansen et al., Proceedings of the IEEE 94 12 2060 2006, entitled "Wafer Direct Bonding: From Advanced Substrate Engineering to Future Applications in Micro/Nanoelectronics."

The topology of non-planar major surface 106 may result in the formation of a discontinuous bonding interface 122 between the donor structure 116 and the non-planar major surface 106 of the processed semiconductor structure 100. Such a discontinuous bonding interface 122 may comprise a number of bonded regions 124 and a number of unbonded regions 126. The bonded regions 124 of discontinuous bonding interface 122 may comprise peak regions 112 of the non-planar major surface 106 of processed semiconductor structure 100 bonded to surface 120 of donor structure 116, and the unbonded regions 126 of discontinuous bonding interface 122 may comprise valley regions 114 of the non-planar major surface 106 of processed semiconductor structure 100.

Upon attachment of donor structure 116 to the non-planar major surface 106 of processed semiconductor structure 100, the donor structure 106 may be thinned to reduce a thickness of the attached donor structure 116 to a value desirable for subsequent processes (e.g., for the fabrication of device structures within a portion of the donor structure 116).

In greater detail, donor structure 116 may be thinned such that a portion of donor structure 116a is carried by (e.g., attached to) processed semiconductor structure 100, and a remaining portion of donor structure 116b is not carried by processed semiconductor structure 100. The donor structure 116 may be thinned by removing material from the donor structure 116 on a side thereof opposite the non-planar major surface 106. The thinning of donor structure 116 may be performed utilizing any of a number of methods, such as, for example, one or more of etching, polishing, grinding, laser lift-off, and chemical-mechanical polishing.

As another non-limiting example, processes known in the industry as SMART-CUT™ processes may be used to thin donor structure 116. Such processes are described in detail in, for example, U.S. Pat. No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (Sep. 20, 2005).

Briefly, in accordance with such embodiments, the donor structure 116 may be thinned by implanting ions 128 into the donor structure 116 through a surface thereof to from a zone of weakness 130 within the donor structure 116. The zone of weakness 130 within the donor structure 116 may be formed prior to bonding the donor structure 116 to the processed semiconductor structure 100.

Upon formation of the zone of weakness 130 and after attaching donor structure 116 to the processed semiconductor structure 100 to form bonded semiconductor structure 118, the temperature of semiconductor structure 118 may be heated to and maintained at an elevated temperature (e.g., above about 100° C.) for an amount of time sufficient to cause the implanted ions within zone of weakness 130 to coalesce and form a plurality of microcavities and/or inclusions within the donor structure 116. Additional energy then may be supplied to the donor structure 116 to promote fracture of donor structure 116 generally along the zone of weakness 130, such that the portion 116b of the donor structure 116 becomes separated from the portion 116a of the donor structure 116 and the processed semiconductor structure 100.

Figure 1C:
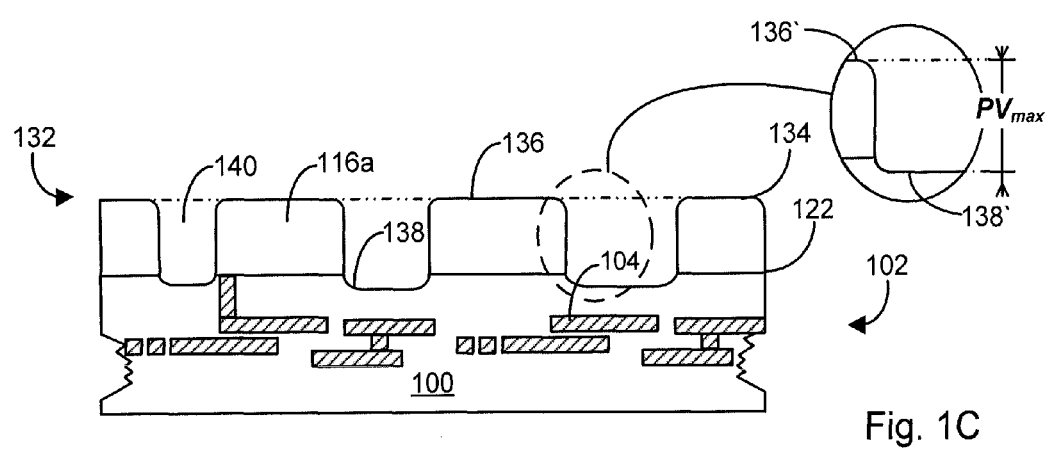

FIG. 1C illustrates bonded semiconductor structure 132, which comprises processed semiconductor structure 100 and a portion of donor structure 116a carried by processed semiconductor structure 100 via discontinuous bonding interface 122. Due to the presence of unbonded areas 126 between donor structure 116 and processed semiconductor structure 100 (see FIG. 1B), the bond strength there between may be insufficient to result in a clean, planar fracture along the zone of weakness 130. As a result, a discontinuous portion of donor structure 116a may be transferred to and carried by processed semiconductor structure 100. In other words, during the fracturing process, the unbonded areas 126 between donor structure 116 and processed semiconductor structure 100 may prevent fracture at the zone of weakness 130 in the vicinity of the unbounded areas 126, such that the fracture surface is non-planar and extends along the zone of weakness in some areas, but along the unbounded areas 126 in other areas. The incomplete transfer of a portion of donor structure 116a to processed semiconductor structure 100 may result in the bonded semiconductor structure 132 having a non-planar major surface 134, as shown in FIG. 1C.

In greater detail, the topology of non-planar major surface 134 comprises a plurality of peak regions 136 and a plurality of valley regions 138. A plurality of recesses 140, which correspond to the volumes of space previously occupied by portions of the donor structure 116 that were not transferred to the processed semiconductor structure 100 as intended, may be disposed over and extend to the plurality of valley regions 138 (i.e., low lying regions of the non-planar major surface 134). In contrast, a portion or portions of donor structure 116a transferred to processed semiconductor 102 comprise or define the plurality of peak regions 136. The maximum peak-to-valley distance may be defined as the maximum vertical distance between the lowest lying valley region 138 and the highest lying peak region 136. For example, the inset of FIG. 1C illustrates a lowest lying valley region 138' and a highest lying peak region 136' of the non-planar major surface 134. The vertical distance between peak region 136' and valley region 138' may be defined as the maximum peak-to-valley distance $PV_{max}$.

Figure 1D:
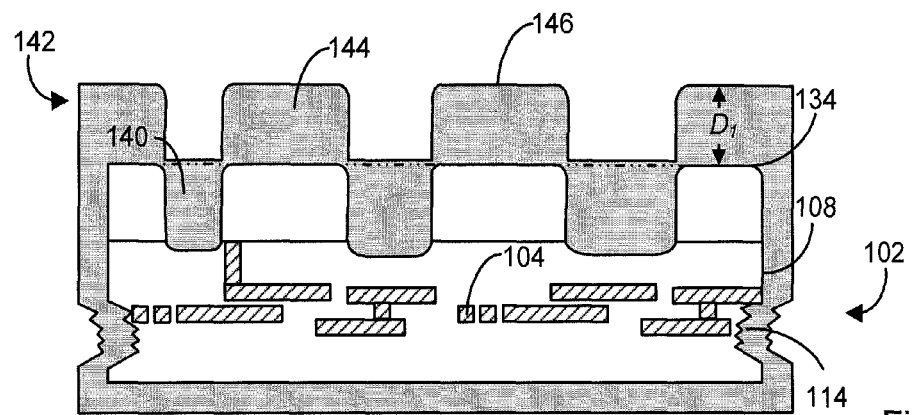

FIG. 1D illustrates a bonded semiconductor structure 142 that comprises an amorphous film 144 formed over the bonded semiconductor structure 132 of FIG. 1C. Amorphous film 144 overlays the bonded semiconductor structure 132 including over the non-planar major surface 134 and the non-planar lateral side surface 108. Amorphous film 144 has an average thickness $D_1$ and may comprise one or more layers of amorphous material. Such amorphous materials may include, for example, one or more of silicon, germanium, silicon carbide, a III-arsenide material, a III-phosphide material, a III-nitride material, and a III-antimonide material.

Amorphous film 144 may be formed over all or a portion of non-planar major surface 134 and non-planar lateral side surface 108 utilizing any of a number of methods. For example, amorphous film 144 may be formed utilizing a deposition method, such as, for example, chemical vapor deposition (CVD). A number of CVD methods are known in the art and may be used to produce the amorphous film 144. Such CVD methods may include one or more of atmospheric pressure CVD (APCVD), low-pressure CVD (LPCVD) and ultra-high vacuum CVD (UHCVD). In some embodiments of the invention, the amorphous film 144 may be formed utilizing low temperature CVD methods. Such methods may include, for example, one or more of LPCVD and plasma-assisted CVD methods, such as, for example, sub-atmospheric CVD (SACVD), microwave plasma-assisted CVD (MPCVD), plasma-enhanced CVD (PECVD) and remote plasma-enhanced CVD (RPECVD). LPCVD and plasma-assisted CVD methods for deposition of the amorphous film 144 may be utilized in some embodiments of the invention to provide a low temperature deposition process.

A low temperature deposition process may be utilized in order to prevent degradation of the device structures 104 present in processed semiconductor structure 100. Therefore, in some embodiments of the invention, amorphous film 144 may be formed at a temperature of less than about 400° C. In additional embodiments of the invention, the amorphous film 144 may be formed at a temperature less than about 500° C., whereas in yet further embodiments of the invention, the amorphous film 144 may be formed at a temperature less than about 600° C.

As illustrated in FIG. 1D, amorphous film 144 may be deposited conformally over the non-planar major surface 134 and the non-planar lateral side surface 108 of bonded semiconductor structure 132. Conformal deposition of amorphous film 144 may be utilized to plug (i.e., at least substantially fill) the plurality of recesses 140 of non-planar major surface 134 and the plurality of recesses disposed over the valley regions 114 of non-planar lateral side surface 108. However, the use of a conformal deposition process to plug recesses in the non-planar surfaces of bonded semiconductor structure 132 may result in the amorphous film 144 itself having non-planar surfaces, such as a non-planar major surface 146 on a side of the amorphous film 144 opposite the processed semiconductor structure 100, since the conformal film may have a thickness $D_1$ that is substantially uniform throughout the amorphous film 144. In other words, the amorphous film 144 may be deposited in such a way that the material of amorphous film 144 substantially preserves the topography of the underlying non-planar surfaces of the bonded semiconductor structure 132 of FIG. 1C.

In some embodiments of the invention, the amorphous film 144 may have an average thickness $D_1$ that is greater than the maximum peak-to-valley distance $PV_{max}$ of the non-planar surfaces of the bonded semiconductor structure 132 of FIG. 1C. The thickness $D_1$ may be selected to be greater than $PV_{max}$ so that a plurality of the recesses 140 and a plurality of the recesses overlying the valley regions 114 may be at least substantially plugged by the amorphous film 144.

Figure 1E:
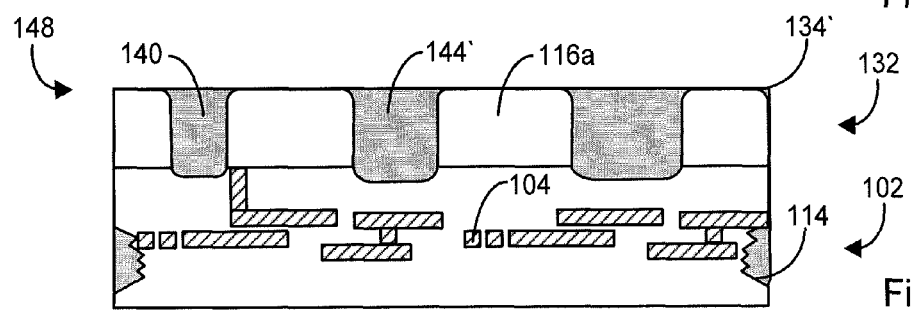

FIG. 1E illustrates bonded semiconductor structure 148, which comprises the bonded semiconductor structure 132 of FIG. 1C, and may be formed by planarizing one or more surfaces of the amorphous film 144 of the bonded semiconductor structure 142 of FIG. 1D. Thus, the bonded semiconductor structure 148 of FIG. 1E includes one or more planarized surfaces, including, for example, planarized major surface 134'. In greater detail, amorphous film 144 may be processed in such a way that the non-planarity of amorphous film 144 is substantially removed, resulting in one or more planarized surfaces (e.g., planarized bonded surface 134'). The planarized bonded surface 134' comprises a portion of donor structure 116a and remaining portions of amorphous film 144'.

A number of methods may be utilized to planarize the amorphous film 144 to form one or more planarized surfaces. For example, the planarization process may be performed utilizing one or more of an etching process, a grinding process and a polishing process. In some embodiments of the invention, the planarization process may be performed utilizing a chemical-mechanical polishing (CMP) process. The CMP process conditions, in particular the slurry abrasives and chemistry, may be chosen so that the non-planarity of the amorphous film 144 is reduced in such a manner as to provide one or more of a planarized major surface 134' and a planarized lateral side surface 108'. In some embodiments of the invention, a portion of the amorphous film 144 may be selectively removed (e.g., by CMP methods) such that remaining portions of amorphous film 144' are disposed in the plurality of recesses 140 and in the plurality of recesses disposed over the valley regions 114, as shown in FIG. 1E.

Figure 1F:
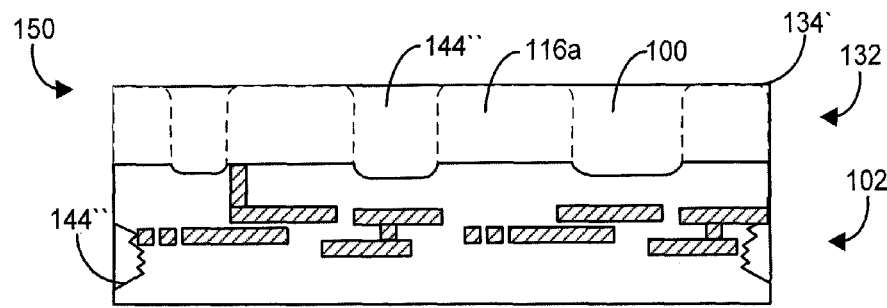

FIG. 1F illustrates a bonded semiconductor structure 150, which comprises bonded semiconductor structure 132, a portion of donor structure 116a, and regions of recrystallized material 144". The regions of recrystallized material 144" may be formed by thermally treating and recrystallizing the remaining portions of amorphous film 144' that are disposed in the plurality of recesses 140 and in the plurality of recesses disposed over the valley regions 114 in the bonded semiconductor structure 148 of FIG. 1E.

In some embodiments of the invention, remaining portions of amorphous film 144' may be thermally treated by a heating process, wherein the heating process raises the temperature of remaining portions of amorphous film 144' to a temperature at least sufficient to promote recrystallization in the amorphous material. Heating of remaining portions of amorphous film 144' to a temperature at least sufficient to promote recrystallization in the amorphous material may form a number of regions of recrystallized material 144". The regions of recrystallized material 144" may comprise one or more of, for example, volumes of nanocrystalline material, volumes of polycrystalline material, and single crystals.

A number of methods may be utilized for the formation of the regions of recrystallized material 144". By way of example and not limitation, the remaining portions of amorphous film 144' may comprise amorphous silicon, and the thermal treatment may comprise one or more of laser annealing, infrared lamp heating, rapid thermal annealing and electrical current-induced joule heating. In some embodiments, the portion of donor structure 116a may be at least substantially comprised of a single crystal of material, which may act as a seed material to the remaining portions of amorphous film 144' during recrystallization, such that the atoms of the amorphous film 144' become incorporated to and part of the single crystal of the donor structure 116a. In such embodiments, there may be no identifiable boundary between the regions of recrystallized material 144" and the donor structure 116a.

Device structures 104 present within processed semiconductor structure 100 may be damaged if the thermal treatment of the recrystallization process is performed at a temperature above a critical temperature for the onset of device degradation. Therefore, in some embodiments of the invention, heating of the remaining portions of amorphous film 144' to a temperature at least sufficient to promote recrystallization in the material is performed at a temperature of less than about 400° C. In additional embodiments, heating of the remaining portions of amorphous film 144' for recrystallization is performed at a temperature less than about 500° C., whereas in yet further embodiments of the invention, heating of the remaining portions of amorphous film 144' for recrystallization is performed at a temperature less than about 600° C.

Upon heating the remaining portions of amorphous film 144' to a temperature sufficient to promote recrystallization of the amorphous material, the temperature of the bonded semiconductor structure 150 is reduced. The resulting bonded semiconductor structure 150 may comprise one or more of single crystal, nanocrystalline and polycrystalline materials and may comprise a substantially planar major surface 134". In some embodiments, such a semiconductor structure may be suitable for the fabrication of additional device structures within the portion of donor structure 116a (including within the regions of recrystallized material 144").

Figure 1G:
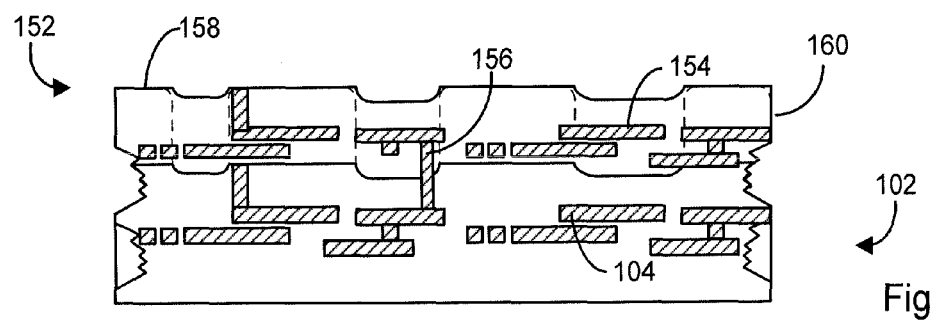

FIG. 1G illustrates bonded semiconductor structure 152, which may be formed by fabricating additional device structures 154 within the portion of donor structure 116a (including within the regions of recrystallized material 144") of the bonded semiconductor structure 150 of FIG. 1F. The device structures 154 formed within the portion of donor structure 116a (including within the regions of recrystallized material 144") may be electrically interconnected to device structures 104 within the processed semiconductor structure 100 using electrically conductive interconnects 156, as shown in FIG. 1G. The interconnects 156 may comprise, for example, conductive vias.

The additional device structure 154 may be formed utilizing methods similar to those described for forming the device structures 104. As previously described for processed semiconductor structure 100, the fabrication of additional device structures 154 to form the bonded semiconductor structure 152 of FIG. 1G may result in the formation of one or more non-planar surfaces in the bonded semiconductor structure 152, such as, for example, a non-planar major surface 158 and a non-planar lateral side surface 160.

Fabrication of additional device structures 154 may include the formation of interconnects 156. The interconnects may provide a route for interconnection between the device structures 104 in processed semiconductor structure 100 and the additional device structures 154.

Additional embodiments of the invention are described below with reference to FIGS. 2A-2E. The embodiments illustrated in FIGS. 2A-2E are similar to those previously described with reference to FIGS. 1A-1G. However, in the embodiments of FIGS. 2A-2E, an additional donor structure is attached to the bonded semiconductor structure 152 (of FIG. 1G) formed utilizing the methods of FIGS. 1A-1G. The material transferred from the additional donor structure to semiconductor structure 152 may undergo further processes for the fabrication of additional device structures therein. The additional device structures may be interconnected to the device structures of the bonded semiconductor structure 152, thereby producing another 3D integrated structure.

Figure 2A:
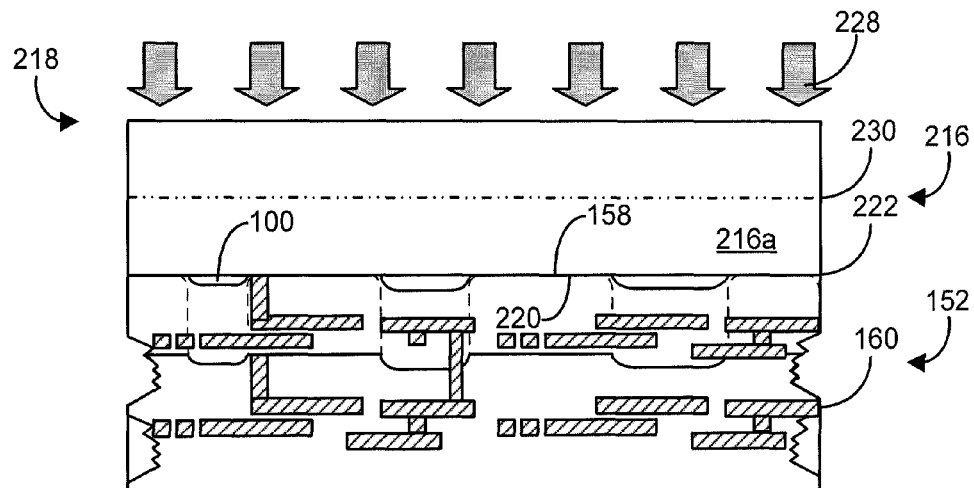
FIGS. 2A-2F schematically illustrate additional example embodiments of the invention for forming bonded semiconductor structures.

Embodiments of the invention described with reference to FIGS. 2A-2E may commence with bonded semiconductor structure 152 of FIG. 1G. Bonded semiconductor structure 152 includes one or more non-planar surfaces, including, for example, non-planar major surface 158 and non-planar lateral side surface 160. FIG. 2A illustrates bonded semiconductor structure 218, which may be formed by attaching another donor structure 216 to the bonded semiconductor structure 152 (of FIG. 1G). Bonded semiconductor structure 152 and the additional donor structure 216 may be attached to one another along a discontinuous bonding interface 222. The non-planar major surface 158 of the bonded semiconductor structure 152 may be attached to a surface 220 of donor structure 216.

The donor structure 216 may be thinned in a manner like that previously discussed in relation to the donor structure 116. For example, ions 228 may be implanted into the donor structure 216 to form a zone of weakness 230 therein. The donor structure 116 then may be fractured along the zone of weakness 230 to thin the donor structure 216 to a desired thickness.

Figure 2B:
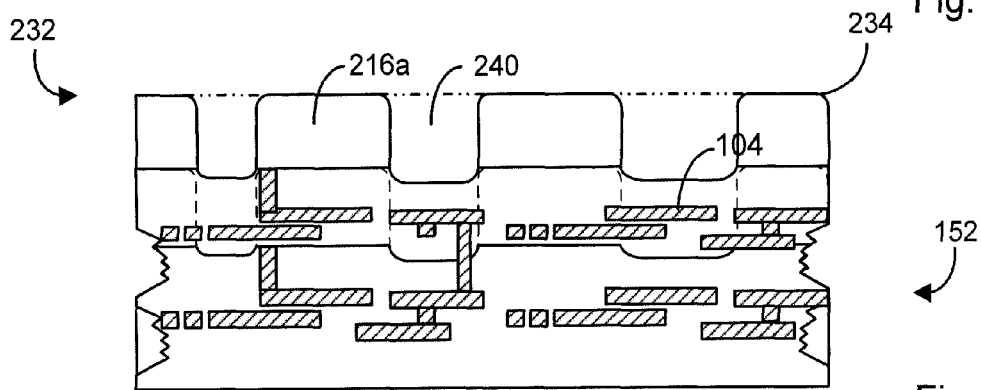

FIG. 2B illustrates a bonded semiconductor structure 232 that includes the bonded semiconductor structure 218 of FIG. 2A, after thinning donor structure 216 such that a portion of donor structure 216a is carried by bonded semiconductor structure 218. The portion of donor structure 216a and a plurality of non-transferred regions 240 may result in the formation of non-planar major surface 234 on the bonded semiconductor structure 232.

Figure 2C:
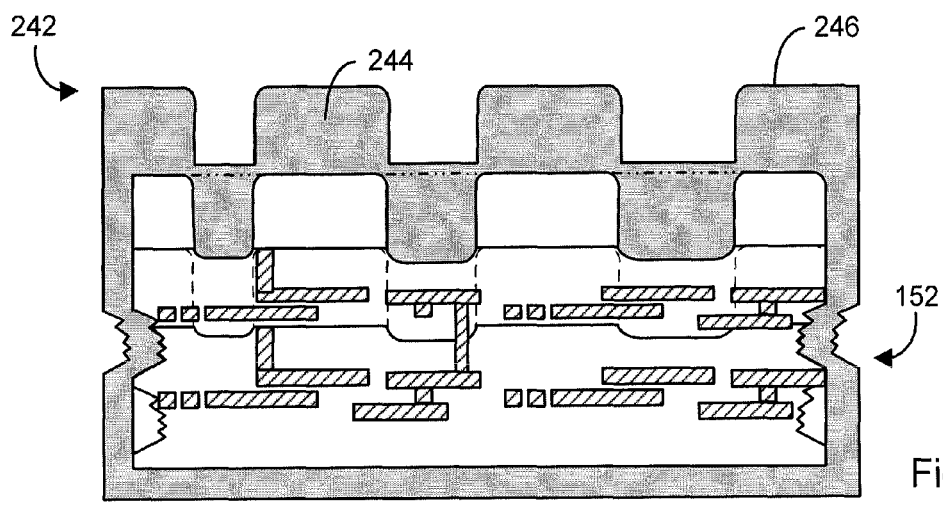

FIG. 2C illustrates another bonded semiconductor structure 242 that may be formed by forming amorphous film 244 over the bonded semiconductor structure 232 of FIG. 2B. The amorphous film 244 may be formed using methods previously described. Amorphous film 244 may include non-planar major surface 246.

Figure 2D:
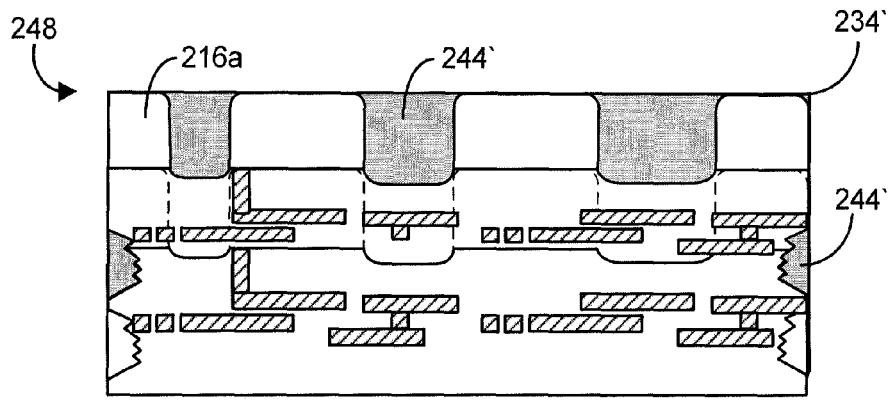

Upon formation of amorphous film 244, the amorphous film 244 may be planarized to form one or more planarized surfaces, such as, for example, a planarized major surface 234' of the bonded semiconductor structure 248 as shown in FIG. 2D. Formation of one or more planarized surfaces may include, for example, utilizing methods such as those previously mentioned. For example, a chemical-mechanical polishing process may be used to planarize the amorphous film 244.

Figure 2E:
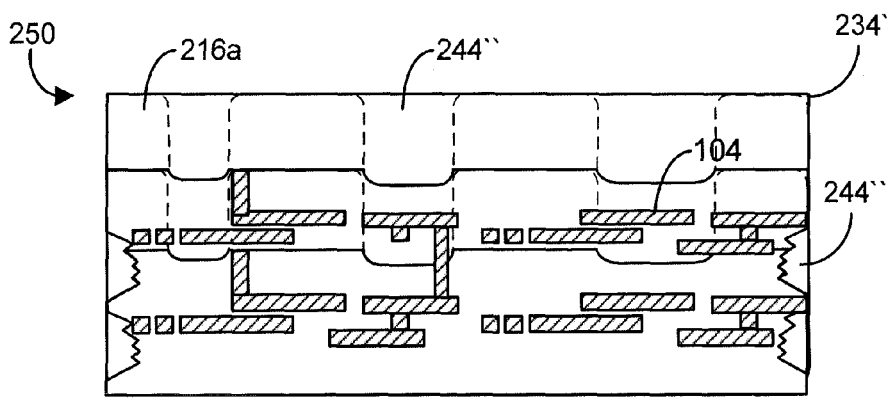

The remaining portions of amorphous film 244' may be thermally treated (as shown in FIG. 2D). For example, the remaining portions of amorphous film 244' may be subjected to a thermal treatment comprising a heating process in which the remaining portions of the amorphous film 244' may be heated to a temperature sufficient to promote recrystallization of the amorphous film, thereby forming a number of regions of recrystallized material 244" as shown in FIG. 2E. Thus, the bonded semiconductor structure 250 shown in FIG. 2E may include a planarized major surface 234' comprising a portion of donor structure 216a and a number of regions of recrystallized material 144".

Figure 2F:
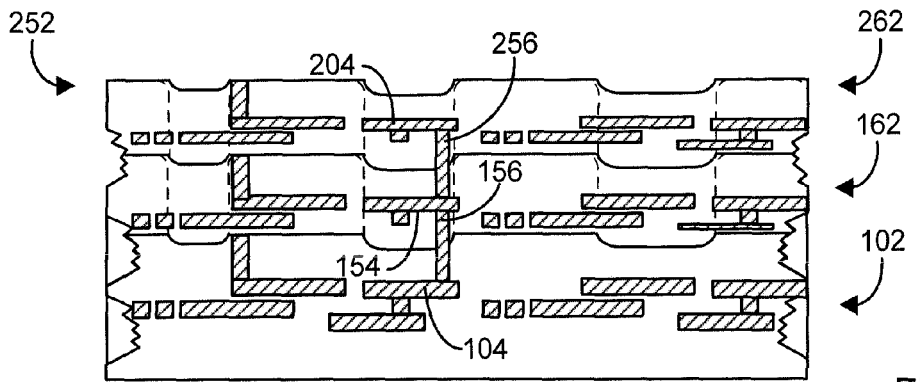

FIG. 2F illustrates a bonded semiconductor structure 252 that may be formed by fabricating additional device structures 204 in the portion of donor structure 216a and the regions of recrystallized material 144". The additional device structures 204 may overlay the device structures 154, which may in turn overlay the device structures 104. A plurality of interconnects 256 and 156 may be formed between the device structures 204, the device structures 154 and the device structure 104, thereby forming a plurality of interconnected device structures within the bonded semiconductor structure 252.

It should be appreciated that yet further donor structure(s) may be attached and processed according to the embodiments of the invention to fabricate bonded semiconductor structures comprising additional device structures, wherein the device structures of each individual processed semiconductor structure may be interconnected to device structures of other processed semiconductor structures of the bonded semiconductor structures.

EXAMPLE

A non-limiting example embodiment of the invention is set forth below. It should be understood that, in the following example, parameters (e.g., materials, structures, etc.) are for illustrative purposes only, and do not limit embodiments of the present invention.

With reference to FIG. 1A, a processed semiconductor structure 100 comprises a complementary metal oxide semiconductor (CMOS) structure including a plurality of transistor device structures 104. CMOS-processed semiconductor structure 100 may be fabricated from a semiconductor structure 110 comprising a single crystal of silicon, in addition to non-semiconductor materials such as silicon oxide, silicon nitrides and metallic materials. The processes used to fabricate the CMOS-processed semiconductor structure 100 include, for example, etching processes, deposition processes, lithography processes and handling processes. Such processes result in non-planar major surface 106 and non-planar lateral side surface 108.

A donor structure 116 (as shown in FIG. 1B) comprising a single crystal silicon substrate is provided. Silicon donor structure 116 is implanted with ions, such as, for example, one or more of hydrogen, helium, and nitrogen ions, to form a zone of weakness 130 within the silicon donor structure 116. The silicon donor structure 116 including the zone of weakness 130 is attached by a bonding process to the CMOS-processed semiconductor structure 100.

The bonding process may include the deposition of one or more bond assisting layers (not shown) upon one or both bonding surfaces. For example, bond-assisting layers may be provided upon at least one of the surface 120 of silicon donor structure 116 and the non-planar major surface 106 of CMOS-processed semiconductor structure 100. The bonding process includes placing non-planar major surface 106 of the CMOS-processed semiconductor structure 100 in intimate contact with surface 120 of the silicon donor structure 116. Further pressure and thermal processes are applied to improve the bond strength between the bonding structures.

Upon attaching CMOS-processed semiconductor structure 100 to silicon donor structure 116, further thermal energy is supplied to promote fracture and separation of the silicon donor structure along the zone of weakness 130. Due to the non-planar major surface 106 of CMOS-processed semiconductor structure 100, a discontinuous portion of silicon donor structure 116a is transferred and carried by CMOS-processed semiconductor structure 100 (as shown in FIG. 1C), resulting in the formation of bonded semiconductor structure 132. A non-planar major surface 134 is formed, which includes a portion of silicon donor structure 116a and recesses 140.

An amorphous silicon film 144 is deposited over the bonded semiconductor structure 132 utilizing a low-pressure chemical vapor deposition (LPCVD) process and silane gas ($SiH_4$) as a precursor at a temperature of less than 400° C. Amorphous silicon film 144 is deposited to an average thickness $D_1$, such that recesses 140 and recesses over valley regions 114 are plugged with amorphous silicon film 144 (as shown in FIG. 1D). A chemical mechanical polishing process is subsequently utilized to planarize the surface 146 of the amorphous silicon film 144, and to selectively remove the non-planarity of the amorphous silicon film 144 and produce planarized major surface 134', as shown in FIG. 1E.

Bonded semiconductor structure 148 (of FIG. 1E) is subjected to a heating process to anneal the bonded semiconductor structure 148 at a temperature of less than 500° C. The annealing process is used to promote recrystallization of the remaining portions of amorphous silicon film 144" and the formation of a plurality of regions of recrystallized silicon 144". Subsequent processes repeat fabricating processes utilized for formation of CMOS-processed semiconductor structure 100 to fabricate additional device structures 154, including additional transistors. The fabrication process includes the formation of a number of interconnects 156, such that device structures 154 are interconnected with device structures 104, thereby forming a 3D integrated structure.

Additional non-limiting example embodiments of the disclosure are described below.

Embodiment 1: A method of forming a semiconductor structure comprising:
  transferring a portion of a donor structure to a processed semiconductor structure and forming a bonded semiconductor structure comprising one or more non-planar surfaces;
  forming an amorphous film over at least the one or more non-planar surfaces of the bonded semiconductor structure; and
  planarizing the amorphous film to form one or more planarized surfaces comprising:
    removing a portion of the amorphous film outside at least one recess in the one or more non-planar surfaces; and
    leaving a portion of the amorphous film within the at least one recess in the one or more non-planar surfaces.

Embodiment 2: The method of Embodiment 1, wherein transferring the portion of the donor structure to the processed semiconductor structure comprises:
  bonding the portion of the donor substrate to a non-planar surface of the processed semiconductor structure along a discontinuous bonding interface therebetween; and
  thinning the donor structure by removing material from the donor structure on a side thereof opposite the non-planar surface of the processed semiconductor structure.

Embodiment 3: The method of Embodiment 2, wherein thinning the donor structure further comprises:
  implanting ions into the donor structure to faun a zone of weakness within the donor structure; and
  fracturing the donor structure at the zone of weakness and detaching another portion of the donor structure from the portion of the donor structure bonded to the non-planar surface of the processed semiconductor structure.

Embodiment 4: The method of any one of Embodiments 1 through 3, wherein transferring the portion of the donor structure to the processed semiconductor structure comprises transferring discontinuous portions of the donor structure to the processed semiconductor structure.

Embodiment 5: The method of any one of Embodiments 1 through 4, wherein forming the amorphous film over at least the one or more non-planar surfaces of the bonded semiconductor structure comprises depositing the amorphous film using a chemical vapor deposition process at a temperature of less than 400° C.

Embodiment 6: The method of any one of Embodiments 1 through 5, wherein planarizing the amorphous film comprises chemically and mechanically polishing the amorphous film.

Embodiment 7: The method of any one of Embodiments 1 through 6, further comprising:
  heating the portion of the amorphous film within the at least one recess in the one or more non-planar surfaces at least to a temperature sufficient to promote recrystallization in the portion of the amorphous film within the at least one recess in the one or more non-planar surfaces; and
  forming one or more device structures on or in the portion of the donor structure transferred to the processed semiconductor structure.

Embodiment 8: The method of Embodiment 7, further comprising electrically interconnecting at least one device structure of the one or more device structures on or in the portion of the donor structure transferred to the processed semiconductor structure with at least one device structure of the processed semiconductor structure.

Embodiment 9: The method of any one of Embodiments 1 through 8, further comprising:
- transferring a portion of another donor structure to the bonded semiconductor structure to form another bonded semiconductor structure that includes one or more non-planar surfaces;
- forming another amorphous film over at least the one or more non-planar surfaces of the another bonded semiconductor structure; and
- planarizing the another amorphous film to form one or more planarized surfaces of the another bonded semiconductor structure comprising:
  - removing a portion of the another amorphous film outside at least one recess in the one or more non-planar surfaces of the another bonded semiconductor structure; and
  - leaving a portion of the another amorphous film within the at least one recess in the one or more non-planar surfaces of the another bonded semiconductor structure.

Embodiment 10: The method of any one of Embodiments 1 through 9, further comprising:
- forming the processed semiconductor structure to comprise a non-planar major surface and a non-planar lateral side surface;
- selecting the donor structure to be at least substantially comprised of a single crystal of semiconductor material; and
- forming a plurality of device structures on or in the processed semiconductor structure prior to transferring portion of the donor structure to the processed semiconductor structure and forming the bonded semiconductor structure;
- wherein transferring the portion of the donor structure comprises transferring the portion of a donor structure to the non-planar major surface of the processed semiconductor structure to form the bonded semiconductor structure, the bonded semiconductor structure having a non-planar major surface and a non-planar lateral side surface; and
- wherein forming the amorphous film comprises forming the amorphous film over the non-planar lateral side surface and the non-planar major surface of the bonded semiconductor structure.

Embodiment 11: A method of forming a semiconductor structure, comprising:
- forming a plurality of device structures on or in a semiconductor structure to produce a processed semiconductor structure comprising a non-planar major surface and a non-planar lateral side surface;
- transferring a portion of a donor structure at least substantially comprised of a single crystal of semiconductor material to the non-planar major surface of the processed semiconductor structure to form a bonded semiconductor structure having a non-planar major surface and a non-planar lateral side surface;
- forming an amorphous film over the non-planar lateral side surface and the non-planar major surface of the bonded semiconductor structure; and
- planarizing at least the non-planar major surface of the bonded semiconductor structure by selectively removing portions of the amorphous film.

Embodiment 12: The method of Embodiment 11, further comprising selecting the donor structure to be at least substantially comprised of the single crystal of semiconductor material.

Embodiment 13: The method of Embodiment 11 or claim 12, further comprising selecting the donor structure to be at least substantially comprised of a single crystal of silicon.

Embodiment 14: The method of any one of Embodiments 11 through 13, further comprising selecting the amorphous film to be at least substantially comprised of amorphous silicon.

Embodiment 15: The method of any one of Embodiments 11 through 14, further comprising:
- heating one or more remaining portions of the amorphous film at least to a temperature sufficient to promote recrystallization of the one or more remaining portions of the amorphous film, and
- forming a plurality of device structures on or in the transferred portion of the donor structure.

Embodiment 16: The method of Embodiment 15, further comprising electrically interconnecting at least one device structure on or in the transferred portion of the donor structure and at least one device structure of the processed semiconductor structure.

Embodiment 17: A semiconductor structure, comprising:
- a bonded semiconductor structure having a non-planar major surface and a non-planar lateral side surface, the bonded semiconductor structure comprising:
  - a processed semiconductor structure comprising a non-planar major surface and a non-planar lateral side surface; and
  - a portion of a single crystal donor structure attached to the non-planar major surface of the processed semiconductor structure; and
- an amorphous film disposed over the non-planar lateral side surface and the non-planar major surface of the bonded semiconductor structure.

Embodiment 18: The semiconductor structure of Embodiment 17, wherein the non-planar major surface of the processed semiconductor structure comprises a plurality of peak regions and a plurality of valley regions, the portion of the single crystal donor structure attached to the plurality of peak regions of the non-planar major surface of the processed semiconductor structure.

Embodiment 19: The semiconductor structure of Embodiment 18, wherein the amorphous film is disposed over the plurality of valley regions of the non-planar major surface of the processed semiconductor structure.

Embodiment 20: The semiconductor structure of any one of Embodiments 15 through 19, wherein the single crystal donor structure is comprised essentially of silicon.

Embodiment 21: The semiconductor structure of any one of Embodiments 17 through 20, wherein the amorphous film is comprised essentially of amorphous silicon.

Embodiment 22: A semiconductor structure comprising:
- a bonded semiconductor structure having a non-planar major surface and a non-planar lateral side surface, the bonded semiconductor structure comprising:
  - a processed semiconductor structure comprising a plurality of device structures, a non-planar major surface, and a non-planar lateral side surface;
  - a portion of a single crystal donor structure attached to the non-planar major surface of the processed semiconductor structure, and
  - a plurality of regions of recrystallized crystalline material disposed over valley regions of the non-planar lateral side surface and the non-planar major surface of the bonded semiconductor structure.

Embodiment 23: The semiconductor structure of Embodiment 22, wherein the plurality of regions of recrystallized crystalline material at least substantially fill recesses in the non-planar major surface of the processed semiconductor structure.

Embodiment 24: The semiconductor structure of Embodiment 22 or Embodiment 23, wherein a plurality of device structures are disposed at least partially within at least some regions of the plurality of regions of recrystallized crystalline material.

Embodiment 25: The semiconductor structure of Embodiment 24, wherein at least one of the device structures disposed at least partially within at least some regions of the plurality of regions of recrystallized crystalline material are electrically interconnected with at least one device structure of the plurality of device structures of the processed semiconductor structure.

The embodiments of the invention described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the invention, in addition to those shown and described herein, such as alternate useful combinations of the elements described, will become apparent to those skilled in the art from the description. Such modifications are also intended to fall within the scope of the appended claims. Headings and legends are used herein for clarity and convenience only.

What is claimed is:

1. A method of forming a semiconductor structure, comprising:
    transferring a portion of a donor structure to a processed semiconductor structure having at least one non-planar feature and forming a bonded semiconductor structure;
    forming one or more non-planar surfaces on a major surface of the bonded structure by forming at least one recess therein, wherein the at least one recess is formed directly above the at least one non-planar feature;
    then forming an amorphous film over at least the one or more non-planar surfaces and into the at least one recess of the bonded semiconductor structure; and
    then planarizing the amorphous film to form one or more planarized surfaces comprising:
        removing a portion of the amorphous film outside the at least one recess in the one or more non-planar surfaces; and
        leaving a portion of the amorphous film within the at least one recess in the one or more non-planar surfaces.

2. The method of claim 1, wherein transferring the portion of the donor structure to the processed semiconductor structure comprises:
    implanting ions into the donor structure to form a zone of weakness within the donor structure; and
    fracturing the donor structure at the zone of weakness and detaching another portion of the donor structure from the portion of the donor structure bonded to the non-planar surface of the processed semiconductor structure.

3. The method of claim 1, wherein transferring the portion of the donor structure to the processed semiconductor structure comprises transferring discontinuous portions of the donor structure to the processed semiconductor structure.

4. The method of claim 1, further comprising:
    heating the portion of the amorphous film within the at least one recess in the one or more non-planar surfaces at least to a temperature sufficient to promote recrystallization in the portion of the amorphous film within the at least one recess in the one or more non-planar surfaces; and
    forming one or more device structures on or in the portion of the donor structure transferred to the processed semiconductor structure.

5. The method of claim 3, further comprising:
    transferring a portion of another donor structure to the bonded semiconductor structure to form another bonded semiconductor structure that includes one or more non-planar surfaces;
    forming another amorphous film over at least the one or more non-planar surfaces of the another bonded semiconductor structure; and
    planarizing the another amorphous film to form one or more planarized surfaces of the another bonded semiconductor structure comprising:
        removing a portion of the another amorphous film outside at least one recess in the one or more non-planar surfaces of the another bonded semiconductor structure; and
    leaving a portion of the another amorphous film within the at least one recess in the one or more non-planar surfaces of the another bonded semiconductor structure.

6. The method of claim 3, further comprising:
    heating the portion of the amorphous film within the at least one recess in the one or more non-planar surfaces at least to a temperature sufficient to promote recrystallization in the portion of the amorphous film within the at least one recess in the one or more non-planar surfaces; and
    forming one or more device structures on or in the portion of the donor structure transferred to the processed semiconductor structure.

7. The method of claim 6, further comprising electrically interconnecting at least one device structure of the one or more device structures on or in the portion of the donor structure transferred to the processed semiconductor structure with at least one device structure of the processed semiconductor structure.

8. The method of claim 1, further comprising:
    transferring a portion of another donor structure to the bonded semiconductor structure to form another bonded semiconductor structure that includes one or more non-planar surfaces;
    forming another amorphous film over at least the one or more non-planar surfaces of the another bonded semiconductor structure; and
    planarizing the another amorphous film to form one or more planarized surfaces of the another bonded semiconductor structure comprising:
        removing a portion of the another amorphous film outside at least one recess in the one or more non-planar surfaces of the another bonded semiconductor structure; and
        leaving a portion of the another amorphous film within the at least one recess in the one or more non-planar surfaces of the another bonded semiconductor structure.

9. The method of claim 1, further comprising:
    forming the processed semiconductor structure to comprise a non-planar lateral side surface;
    selecting the donor structure to be at least substantially comprised of a single crystal of semiconductor material; and forming a plurality of device structures on or in the processed semiconductor structure prior to transferring a portion of the donor structure to the processed semiconductor structure and forming the bonded semiconductor structure; and wherein transferring the portion of the donor structure comprises transferring the portion of the donor structure to the non-planar major surface of the processed semiconductor structure to form the bonded semiconductor structure, the bonded semiconductor structure having a non-planar major surface and a non-planar lateral side surface; and wherein forming the amorphous film comprises forming the amorphous film over the non-planar lateral side surface and the non-planar major surface of the bonded semiconductor structure.

10. The method of claim 9, further comprising selecting the donor structure to be at least substantially comprised of single crystal silicon.

11. The method of claim 9, further comprising selecting the amorphous film to be at least substantially comprised of amorphous silicon.

12. A method of forming a semiconductor structure, comprising:

forming a processed semiconductor structure to comprise a non-planar major surface and a non-planar lateral side surface and forming a plurality of device structures on or in the processed semiconductor structure;

selecting a donor structure at least substantially comprised of a single crystal of semiconductor material;

after forming the plurality of device structures, transferring a portion of the donor structure to the processed semiconductor structure and forming a bonded semiconductor structure comprising one or more non-planar surfaces;

forming an amorphous film over at least the one or more non-planar surfaces of the bonded semiconductor structure; and planarizing the amorphous to form one or more planarized surfaces comprising:

removing a portion of the amorphous film outside at least one recess in the one or more non-planar surfaces; and leaving a portion of the amorphous film within the at least one recess in the one or more non-planar surfaces; and wherein transferring the portion of the donor structure comprises transferring the portion of a donor structure to the non-planar major surface of the processed semiconductor structure to form the bonded semiconductor structure, the bonded semiconductor structure having a non-planar major surface and a non-planar lateral side surface; and wherein forming the amorphous film comprises forming the amorphous film over the non-planar lateral side surface and the non-planar major surface of the bonded semiconductor structure.

13. The method of claim 12, further comprising selecting the amorphous film to be at least substantially comprised of amorphous silicon.

14. The method of claim 12, further comprising selecting the donor structure to be at least substantially comprised of single crystal silicon.

15. The method of claim 14, further comprising selecting the amorphous film to be at least substantially comprised of amorphous silicon.

\* \* \* \* \*

UNITED STATES PATENT AND TRADEMARK OFFICE
CERTIFICATE OF CORRECTION

PATENT NO. : 8,987,114 B2  
APPLICATION NO. : 13/637565  
DATED : March 24, 2015  
INVENTOR(S) : Carlos Mazure, Bich-Yen Nguyen and Mariam Sadaka Page 1 of 1

It is certified that error appears in the above-identified patent and that said Letters Patent is hereby corrected as shown below:

In the claims:
CLAIM 12,   COLUMN 18,  LINE 4,   change "amorphous to" to --amorphous film to--

Signed and Sealed this  
Twenty-ninth Day of September, 2015

Michelle K. Lee  
*Director of the United States Patent and Trademark Office*